(12) United States Patent
Gummalla et al.

(10) Patent No.: US 8,768,653 B2
(45) Date of Patent: Jul. 1, 2014

(54) SYSTEMS AND METHODS FOR MODELING COMPLIANT PARTS

(75) Inventors: Rakesh Gummalla, Cincinnati, OH (US); Richard Shane Mays, Cincinnati, OH (US); Mel Allende-Blanco, Loveland, OH (US); James William Busch, Maineville, OH (US); Eva Grace Nellenbach, Reading, OH (US); Matthew Howard Wasson, Cincinnati, OH (US); Kerry Lloyd Weaver, Florence, KY (US); Ayub Ibrahim Khan, Cincinnati, OH (US)

(73) Assignee: The Procter & Gamble Company, Cincinnati, OH (US)

( * ) Notice: Subject to any disclaimer, the term of this patent is extended or adjusted under 35 U.S.C. 154(b) by 438 days.

(21) Appl. No.: 13/172,417

(22) Filed: Jun. 29, 2011

(65) Prior Publication Data

US 2013/0006587 A1 Jan. 3, 2013

(51) Int. Cl.
*G06F 17/50* (2006.01)

(52) U.S. Cl.
USPC .................................................. 703/1

(58) Field of Classification Search
USPC .................................................. 703/1
See application file for complete search history.

(56) References Cited

U.S. PATENT DOCUMENTS 5,657,516 A * 8/1997 Berg et al. .................. 24/452

OTHER PUBLICATIONS

ASTM D 4846—96 (Reapproved 2004) Standard Test Method for Resistance to Unsnapping of Snap Fasteners; 2004; pp. 1-4.*

ASTM D638—08 Standard Test Method for Tensile Properties of Plastics; 2008; 16 pages.*
Suri: A Fundamental Investigation of Retention Phenomena in Snap-fit Features; Ph D Thesis; Ohio State University; 2002; 256 pages.*
International Search Report dated Jun. 27, 2012, 12 pages.
Suat Genc, Robert W. Messler, Gary A. Gabriele., *Integral attachment using snap fit features: a key to assembly automation. Part 5—a procedure to constrain parts fully and generate alternative attachment concepts*, Assembly Automation, Bedford:1998. vol. 18, Iss. 1, 9 pages.
Jocelyn Lally, *Analysis of Snap Fit Dynamics*, Apr. 25, 2007, Worcester Polytechnic Institute, pp. 56-59.
Th. Meitinger, F. Pfeiffer, *Modeling and Simulation of the Assembly of Snap Joints*, Lehrstuhl B fur Mechanik, Technische Universitat Munchen, 80290 Munich Germany, 1995 pp. 15-20.
Paul R. Bonenberger, *An Attachment Level Design Process for Snap-Fit Applications*, DE-99 vol. 7, Applications for Design Manufacturing, ASME 1998.

(Continued)

*Primary Examiner* — Hugh Jones
(74) *Attorney, Agent, or Firm* — Andres E. Velarde; Megan C. Hymore

(57) ABSTRACT

Included are systems and methods for modeling compliant parts. Some of the systems and/or methods include creating a 3-dimensional simulation of a product that includes an outer part and an inner part, determining a deformation characteristic of the product, and simulating an interaction of the inner part with the outer part. Similarly, in some of the systems and/or methods a characteristic of interaction may be measured from the interaction, a determination may be made regarding whether the characteristic of interaction meets a predetermined threshold. In some of the systems and/or methods, in response to determining that the characteristic of interaction meets the predetermined threshold, an output may be sent indicating product design acceptability. In response to determining that the characteristic of interaction does not meet the predetermined threshold, the 3-dimensional simulation may be iteratively altered until the characteristic of interaction meets the predetermined threshold.

5 Claims, 6 Drawing Sheets

(56) References Cited

OTHER PUBLICATIONS

W. Gregory Sawyer, Theirry A. Blanchet, Keith N. Knapp II, Daeyong Lee, *Friction Modeling and Experimentation for Integral Fasteners, Department of Mechanical Engineering*, Aeronautical Engineering and Mechanics, Rensselaer Polytechnic Institute, Troy NY 12180, PhD Thesis 105 pp. 2007.

W.W. Chow, *Snap fit Design Concepts*, Modern Plastics, 1977.

Lloyd Wang, Dr. Gary A. Gabriele, Anthony F. Luscher, *Failure Analysis of a Bayonet-Finger Snap-Fit*, ANTEC, 1995, pp. 3799-3803.

Gerald G. Trantina, Mark D. Minnichelli, *The Effect of Nonlinear Material Behavior on Snap-Fit Design*, ANTEC, 1987, pp. 438-441.

A.K. Soh, E.N. Lim, *A Parametric Study for Improving Snapfit Design*, Journal of Materials Processing Technology 25, 1991, pp. 91-103.

\* cited by examiner

SYSTEMS AND METHODS FOR MODELING COMPLIANT PARTS

FIELD OF THE INVENTION

The present application relates generally to systems and methods for modeling compliant parts and specifically to a computerized simulation process for modeling interrelated parts of a product.

BACKGROUND OF THE INVENTION

Design of a product with a plurality of interrelated parts is currently a difficult, expensive, and time consuming task. As an example, many products include components that are assembled and dissembled by a user and, as such, these components may be designed to allow for easy assembly by the user. The parts may additionally be configured to remain secure while assembled, but still be relatively easy for the user to disassemble (partially and/or fully). Designing and producing these products is currently difficult because product designers must physically create a prototype and test that prototype for acceptability. If the prototype is not acceptable, the product designers must redesign and recreate the prototype. As it often takes numerous repetitions of this process to design a product that meets the desired specifications, a need exists in the industry.

SUMMARY OF THE INVENTION

The present invention relates to a method for modeling compliant parts, comprising: creating a 3-dimensional simulation of a product that comprises an outer part and an inner part, the inner part comprising a first ridge on an exterior surface, the first ridge configured for engaging with an interior surface of the outer part such that upon inserting the inner part into the outer part, the inner part becomes removably secured to the outer part; determining a deformation characteristic of the product; simulating an interaction of the inner part with the outer part; measuring, from the interaction, a characteristic of interaction; determining, by a computing device, whether the characteristic of interaction meets a predetermined threshold; in response to determining that the characteristic of interaction meets the predetermined threshold, sending an output indicating product design acceptability; and in response to determining that the characteristic of interaction does not meet the predetermined threshold, iteratively altering the 3-dimensional simulation until the characteristic of interaction meets the predetermined threshold.

The present invention further relates to a system for modeling compliant parts, comprising: a memory component that stores logic that when executed by the system causes the system to perform at least the following: receive a 3-dimensional simulation of a product that comprises an outer part and an inner part, the inner part comprising a first ridge on an exterior surface, the first ridge configured for engaging with an interior surface of the outer part such that upon inserting the inner part into the outer part, the inner part becomes removably secured to the outer part; determine a deformation characteristic of the product; simulate an interaction of the inner part with the outer part; measure, from the interaction, a first assembly force, a separation force, a retraction force, and a permanent deformation value, wherein the first assembly force represents a first force for overcoming resistance to assembly created by the first ridge, and wherein the separation force represents a second force for overcoming the first ridge when removing the inner part from the outer part; determine whether the first assembly force meets a predetermined first assembly force threshold; determine whether the second assembly force meets a predetermined second assembly force threshold; determine whether the separation force meets a predetermined separation force threshold; determine whether the retraction force meets a predetermined retraction force threshold; determine whether the permanent deformation value meets a predetermined permanent deformation threshold; in response to determining that the first assembly force meets the predetermined first assembly force threshold, the second assembly force meets the predetermined second assembly force threshold, the separation force meets the predetermined separation force threshold, the retraction force meets the predetermined retraction force threshold, and the permanent deformation value meets the predetermined permanent deformation threshold, send an output that indicates the first 3-dimensional simulation and the second 3-dimensional simulation are acceptable product designs; and in response to determining that at least one of the following: the first assembly force does not meet the predetermined first assembly force threshold, second assembly force does not meet the predetermined second assembly force threshold, the retraction force does not meet the predetermined retraction force threshold, the separation force does not meet the predetermined separation force threshold, and the permanent deformation value does not meet the predetermined permanent deformation threshold, iteratively alter the 3-dimensional simulation until the first assembly force meets the predetermined first assembly force threshold, the second assembly force meets the predetermined second assembly force threshold, the separation force meets the predetermined separation force threshold, the retraction force meets the predetermined retraction force threshold, and the permanent deformation value meets the predetermined permanent deformation threshold.

The present invention still further relates to a non-transitory computer-readable medium for modeling compliant parts that stores a computer program that when executed by a computing device, causes the computing device to perform at least the following: receive a 3-dimensional simulation of a product that comprises an outer part and an inner part, the inner part comprising a first ridge on an exterior surface, the first ridge configured for engaging with an interior surface of the outer part such that upon inserting the inner part into the outer part, the inner part becomes removably secured to the outer part; determine a deformation characteristic of the product; simulate an interaction of the inner part into the outer part; measure, from the interaction, a characteristic of interaction; determine whether the characteristic of interaction meets a predetermined threshold; in response to determining that the characteristic of interaction meets the predetermined threshold, send an output that indicates the first 3-dimensional simulation and the second 3-dimensional simulation are acceptable product designs; and in response to determining that the characteristic of interaction does not meet the predetermined threshold, iteratively alter the 3-dimensional simulation until the characteristic of interaction meets the predetermined threshold.

BRIEF DESCRIPTION OF THE DRAWINGS

The accompanying drawings are included to provide a further understanding of the present inventions, and are incorporated into and constitute a part of this specification. The drawings illustrate the present inventions described herein, and together with the description serve to explain the principles and operations of the claimed subject matter.

DETAILED DESCRIPTION OF THE INVENTION

Figure 1:
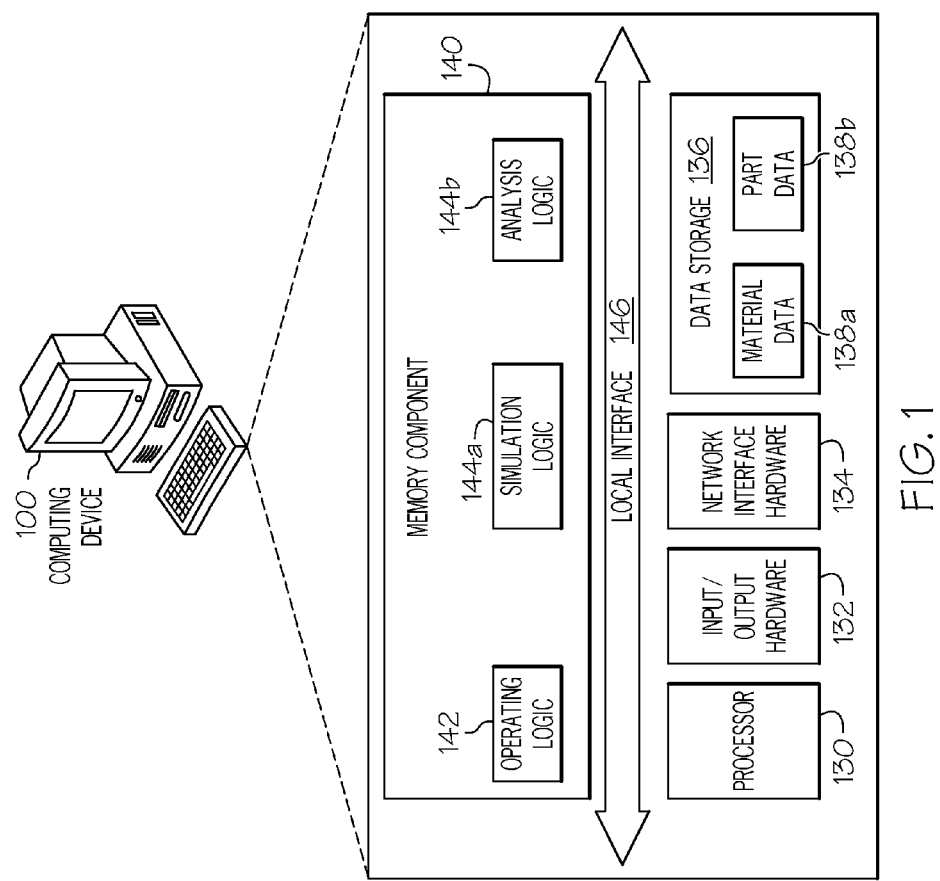
FIG. 1 depicts a computing device for modeling compliant parts, according to systems and methods disclosed herein.

The present inventions include systems and methods for modeling compliant parts. More specifically, the systems and/or methods may include creating a 3-dimensional simulation of a product that has yet to be produced. The product (and the virtual product) may be configured as a tampon applicator, a razor, a coffee maker, a children's toy, a product packaging, a child-resistant packaging (such as a child-resistant bottle), a snap bottle closure, and/or other product and includes two components that are configured to be removably connected. The two components may include an inner part and an outer part, where the inner part is configured to fit inside the outer part and removably lock into place (e.g., snap fit). The inner part may include a first ridge and a second ridge that physically communicate with the outer part to facilitate this locking mechanism. Additionally, the systems and methods described herein may determine a deformation characteristic and/or various characteristics of interaction. The characteristic of interaction may include a first assembly force, a second assembly force, a separation force, a retraction force, and/or a permanent deformation value. Additionally, a determination may be made regarding whether the characteristic of interaction meets a predetermined threshold. If so, an output may be sent indicating product design acceptability and the simulation may be used to create the product. If not, the 3-dimensional simulation may be iteratively altered until the characteristic of interaction meets the predetermined threshold.

Also included is a computing device that includes a memory component that stores logic that causes the system to receive a 3-dimensional simulation of a product that includes an outer part and an inner part. The inner part may include a first ridge on an exterior surface. The first ridge may be disposed proximate to an end 203a of the inner part and may be configured for engaging with an interior surface of the outer part such that upon inserting the inner part into the outer part, the inner part becomes removably secured to the outer part. The logic may additionally cause the system to determine a deformation characteristic of the product, simulate an interaction of the inner part with the outer part, and measure, from the interaction, a first assembly force, a separation force, a retraction force, and a permanent deformation value. The first assembly force may represent a first force for overcoming resistance to assembly created by the first ridge. The separation force may represent a second force for overcoming the first ridge when removing the inner part from the outer part. The logic may further cause the system to determine whether the first assembly force meets a predetermined first assembly force threshold, determine whether the second assembly force meets a predetermined second assembly force threshold, determine whether the separation force meets a predetermined separation force threshold, determine whether the retraction force meets a predetermined retraction force threshold, and determine whether the permanent deformation value meets a predetermined permanent deformation threshold.

Additionally, in response to determining that the first assembly force meets the predetermined first assembly force threshold, the second assembly force meets the predetermined second assembly force threshold, the separation force meets the predetermined separation force threshold, the retraction force meets the predetermined retraction force threshold, and the permanent deformation value meets the predetermined permanent deformation threshold, the logic may cause the system to send an output that indicates the first 3-dimensional simulation and the second 3-dimensional simulation are acceptable product designs. In response to determining that the first assembly force does not meet the predetermined first assembly force threshold, second assembly force does not meet the predetermined second assembly force threshold, the retraction force does not meet the predetermined retraction force threshold, the separation force does not meet the predetermined separation force threshold, and/or the permanent deformation value does not meet the predetermined permanent deformation threshold, the logic may cause the system to iteratively alter the 3-dimensional simulation until the first assembly force meets the predetermined first assembly force threshold, the second assembly force meets the predetermined second assembly force threshold, the separation force meets the predetermined separation force threshold, the retraction force meets the predetermined retraction force threshold, and the permanent deformation value meets the predetermined permanent deformation threshold.

Also included is a non-transitory computer-readable medium that stores a program that when executed by a computing device causes the computing device to receive a 3-dimensional simulation of a product that comprises an outer part and an inner part. The inner part may include a first ridge on an exterior surface that is configured for engaging with an interior surface of the outer part such that upon inserting the inner part into the outer part, the inner part becomes removably secured to the outer part. Additionally, the program may further cause the computing device to determine a deformation characteristic of the product, simulate an interaction of the inner part into the outer part, measure, from the interaction, a characteristic of interaction, and determine whether the characteristic of interaction meets a predetermined threshold. In response to determining that the characteristic of interaction meets the predetermined threshold, the program may cause the computing device to send an output that indicates the first 3-dimensional simulation and the second 3-dimensional simulation are acceptable product designs. In response to determining that the characteristic of interaction does not meet the predetermined threshold, the program may iteratively alter the 3-dimensional simulation until the characteristic of interaction meets the predetermined threshold.

Referring now to the drawings, FIG. 1 depicts a computing device 100 for modeling compliant parts, according to systems and methods disclosed herein. As illustrated, the computing device 100 includes a processor 130, input/output hardware 132, network interface hardware 134, a data storage component 136 (which stores material data 138a, part data 138b, and/or other data), and the memory component 140. The memory component 140 may be configured as volatile and/or nonvolatile memory and as such, may include random access memory (including SRAM, DRAM, and/or other types of RAM), flash memory, secure digital (SD) memory, registers, compact discs (CD), digital versatile discs (DVD), and/or other types of non-transitory computer-readable mediums. Depending on the particular system, these non-transitory computer-readable mediums may reside within the computing device 100 and/or external to the computing device 100.

Additionally, the memory component 140 may store operating logic 142, simulation logic 144a, and analysis logic 144b. The simulation logic 144a and the analysis logic 144b may each include a plurality of different pieces of logic, each of which may be embodied as a computer program, firmware, and/or hardware, as an example. A local interface 146 is also included in FIG. 1 and may be implemented as a bus or other communication interface to facilitate communication among the components of the computing device 100.

The processor 130 may include any processing component operable to receive and execute instructions (such as from the data storage component 136 and/or the memory component 140). The input/output hardware 132 may include and/or be configured to interface with a monitor, positioning system, keyboard, mouse, printer, image capture device, microphone, speaker, gyroscope, compass, and/or other device for receiving, sending, and/or presenting data. The network interface hardware 134 may include and/or be configured for communicating with any wired or wireless networking hardware, including an antenna, a modem, LAN port, wireless fidelity (Wi-Fi) card, WiMax card, mobile communications hardware, and/or other hardware for communicating with other networks and/or devices. From this connection, communication may be facilitated between the computing device 100 and other computing devices.

The operating logic 142 may include an operating system and/or other software for managing components of the computing device 100. Similarly, as discussed above, the simulation logic 144a may reside in the memory component 140 and may be configured to cause the processor 130 to create a 3-dimensional simulation of a product. Similarly, the analysis logic 144b may include a proprietary software, such as ABAQUS™, LS DYNA™, ANSYS™, MARC™, and/or may include other logic for causing the processor 130 to utilize the 3-dimensional simulation to determine various characteristics of the virtual product and determine whether the virtual product meets predetermined thresholds. Other functionality is also included and described in more detail, below.

It should be understood that the components illustrated in FIG. 1 are merely illustrative and are not intended to limit the scope of this disclosure. While the components in FIG. 1 are illustrated as residing within the computing device 100, this is merely an example. One or more of the components may reside external to the computing device 100. It should also be understood that, while the computing device 100 in FIG. 1 is illustrated as a single device, this is also merely an example. The simulation logic 144a and the analysis logic 144b may reside on different devices.

Additionally, while the computing device 100 is illustrated with the simulation logic 144a and the analysis logic 144b as separate logical components, this is also an example. A single piece of logic may cause the computing device 100 to provide the described functionality.

Figure 2:
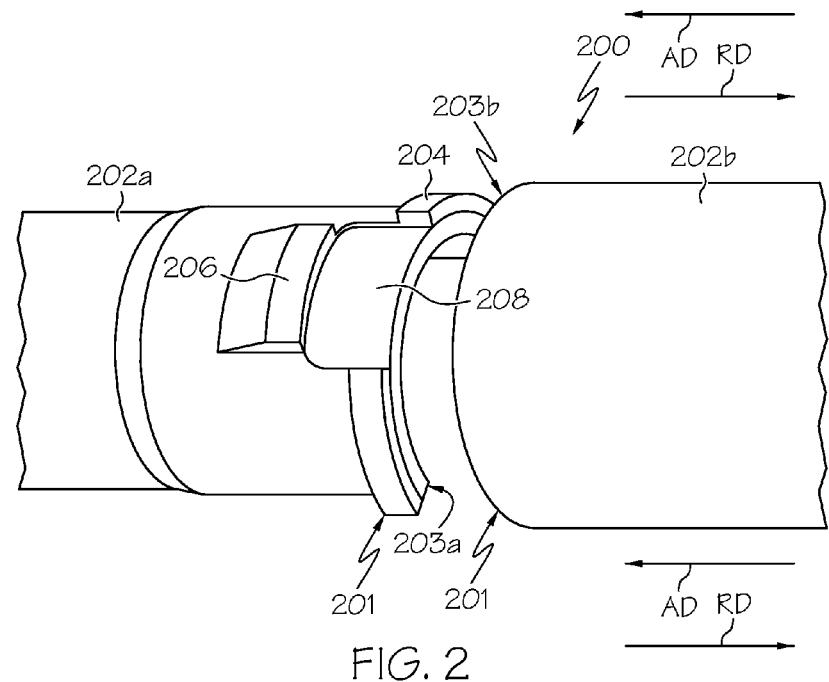
FIG. 2 depicts a simulation of a product, according to systems and methods disclosed herein.

FIG. 2 depicts a simulation 200 of a product 201, according to systems and methods disclosed herein. As illustrated, the simulation 200 may be a 3-dimensional simulation of a product 201 that includes an inner part 202a and an outer part 202b. The inner part 202a may include a first ridge 204, a second ridge 206, and a recess 208. The first ridge 204 may be disposed proximate to an end 203a of the inner part 202a, may extend outwardly from an outer surface of the inner part 202a and may have a circumference greater than that of the remaining surfaces of the inner part 202a. In areas around the circumference that do not include the first ridge 204, the recess 208 may be situated. While the recess 208 may be co-planar with the remaining surfaces of the inner part 202a, this is not a requirement. The recess 208 may be configured in a recessed configuration with respect to not only the first ridge 204, but the remaining surfaces of the inner part 202a, as well. Also included is the second ridge 206, which is displaced a distance from the end 203a of the inner part 202a, where the distance may be between about 0.1 mm to about 30 mm. The second ridge 206 may extend outwardly from the inner part 202a and may taper away from the recess 208.

Also included in FIG. 2 is the outer part 202b. As discussed above, the outer part 202b may receive the inner part 202a and may additionally include an inner ridge (not shown in FIG. 2) to removably secure the inner part 202a inside the outer part 202b. Regardless, when the outer part 202b engages with the first ridge 204, a first assembly force may be required to move the first ridge 204 past the end of the outer part 202b in an assembly direction AD. Once the end of the outer part 202b is moved past the first ridge 204, the end of the outer part 202b may encounter the second ridge 206, which may require a second assembly force to move past. Once past the second ridge 206, the inner part 202a may be moved in an opposite, or retraction, direction RD by the user. The user force for this motion is the retraction force. The force required to remove the inner part 202a from the outer part 202b is the separation force.

Accordingly, the computing device 100 may be configured to create the simulation 200, which not only simulates the shapes of the inner part 202a and the outer part 202b, but also simulates the first assembly force, the second assembly force, the retraction force, and the separation force. This analysis may be performed by specifying the exact dimensions of the inner part 202a and the outer part 202b, as well as specifying the material used for each of the parts. The materials used in the product 201 may include polymers, metals, and/or other materials. One will appreciate that the product modeled may comprise more than two ridges and their related assembly forces.

Additionally, as friction is a force that restricts assembly and disassembly, the first ridge 204, the second ridge 206, and/or other parts of the product 201 may be deformed after repeated use. As discussed in more detail below, the computing device 100 may additionally determine a permanent deformation value for the product 201.

It should be understood that while the simulation illustrated in FIG. 2 depicts a particular product (a tampon applicator), this is merely an example. The product modeled may comprise at least one of the following: a tampon applicator, a razor, a coffee maker, a children's toy, a product packaging, a child-resistant packaging (such as a child-resistant bottle), a snap bottle closure, and/or other product. More specifically, any product may be modeled and/or simulated according to the systems and methods described herein.

Figure 3:
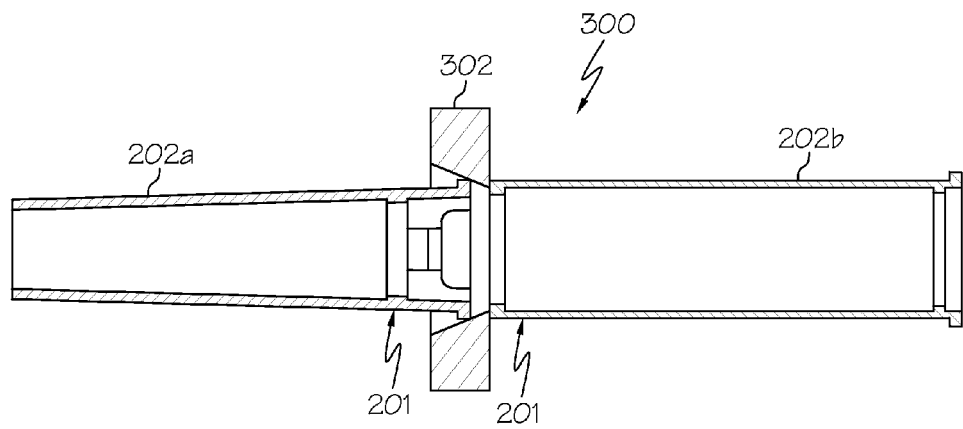
FIG. 3 depicts a simulation of the product, further illustrating specifications for inserting an inner part into an outer part, according to systems and methods disclosed herein.

FIG. 3 depicts a simulation 300 of the product 201 of FIG. 2, further illustrating specifications for inserting an inner part 202a into an outer part 202b, according to systems and methods disclosed herein. As illustrated, the inner part 202a and the outer part 202b may be axially aligned for assembly.

Additionally, a virtual funnel 302 may be utilized in the simulation 300 to assist in this alignment and ensure proper assembly with the most consistent evaluations of the first assembly force, the second assembly force, and the permanent deformation value. Once the inner part 202a and the outer part 202b are properly aligned, the computing device 100 may simulate insertion of the inner part 202a into the outer part 202b and may determine the forces, such as the forces described herein and permanent deformation value.

It should be understood that by misaligning the inner part 202a and/or the outer part 202b, the forces described above may exponentially increase. As such, misalignment may provide substantially incorrect results in determining a feasibility of a product design. The simulation may also be performed without a funnel to determine effect of misalignment on assembly forces and deformation. With that said, a temporary physical modification may be made to the simulation and the characteristics of interaction may be performed with the temporary physical modification. The temporary physical modification may include inserting the inner part 202a at a first predetermined angle with respect to the outer part 202b and realigning the inner part 202a as the inner part 202a is inserted. Similarly, the temporary modification may include squeezing the inner part 202a while assembling the inner part 202a and the outer part 202b; and squeezing the inner part 202a while removing the inner part 202a from the outer part 202b.

Figure 4:
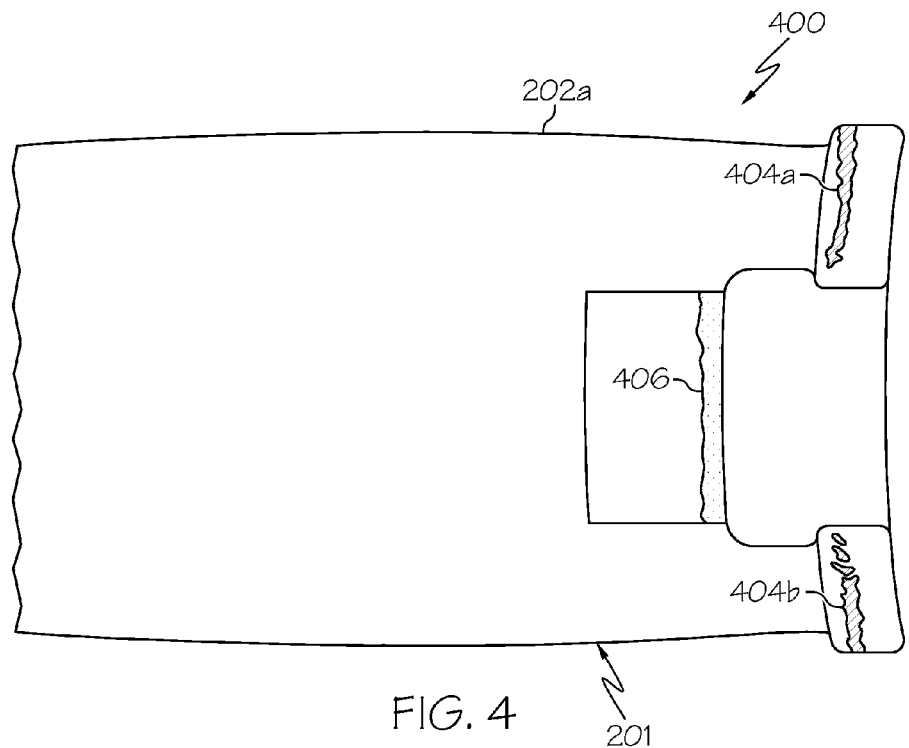
FIG. 4 depicts a simulation of the product further illustrating contact points on the product, according to systems and methods disclosed herein.

FIG. 4 depicts a simulation 400 of the product 201, further illustrating contact points on the product 201, according to systems and methods disclosed herein. As illustrated, the computing device 100 may predict the first assembly force and the second assembly force (and/or other forces). The computing device 100 may assume a friction coefficient value, which may depend on the materials utilized in the simulation 400. From the data provided in the simulation 400, a determination may be made regarding whether the first assembly force and/or the second assembly force meet predetermined thresholds, which may be determined, such as, for example, by a technician. As illustrated, areas 404a, 404b indicate the points of contact and first assembly force that are encountered when assembling the product 201. Area 406 indicates the points of contact and second assembly force encountered when assembling the product 201.

Figure 5:
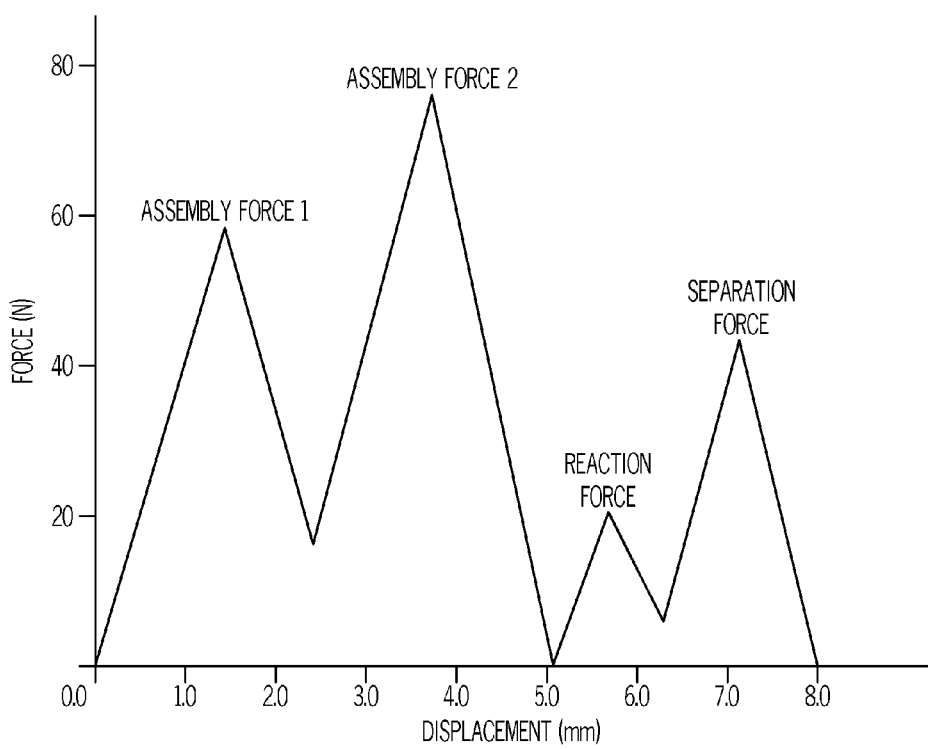
FIG. 5 depicts a graphical representation of force for assembling and disassembling the inner part and the outer part, according to systems and methods disclosed herein.

FIG. 5 depicts a graphical representation of force for assembling and disassembling the inner part 200a and the outer part 200b, according to systems and methods disclosed herein As illustrated, the graphical representation indicates a force (in Newtons) on a y-axis and a displacement (in millimeters) on an x-axis. The force is at a maximum at four distinct areas of displacement: at about 1.5 mm, at about 3.75 mm, at about 5.75 mm, and at about 7.0 mm. As is evident, these maximums occur when the outer part 202b is passing the first ridge 204 (e.g., the first assembly force) and the second ridge 206 (e.g., the second assembly force), when the inner part 200a snaps into a locked position (e.g., the retraction force), and when the product 201 is partially and/or fully disassembled (e.g., the separation force), respectively. This data may additionally be compared with a predetermined threshold for each of the first assembly force and the second assembly force to determine whether the current product design (of the simulations from FIG. 2-4) is acceptable.

Figure 6:
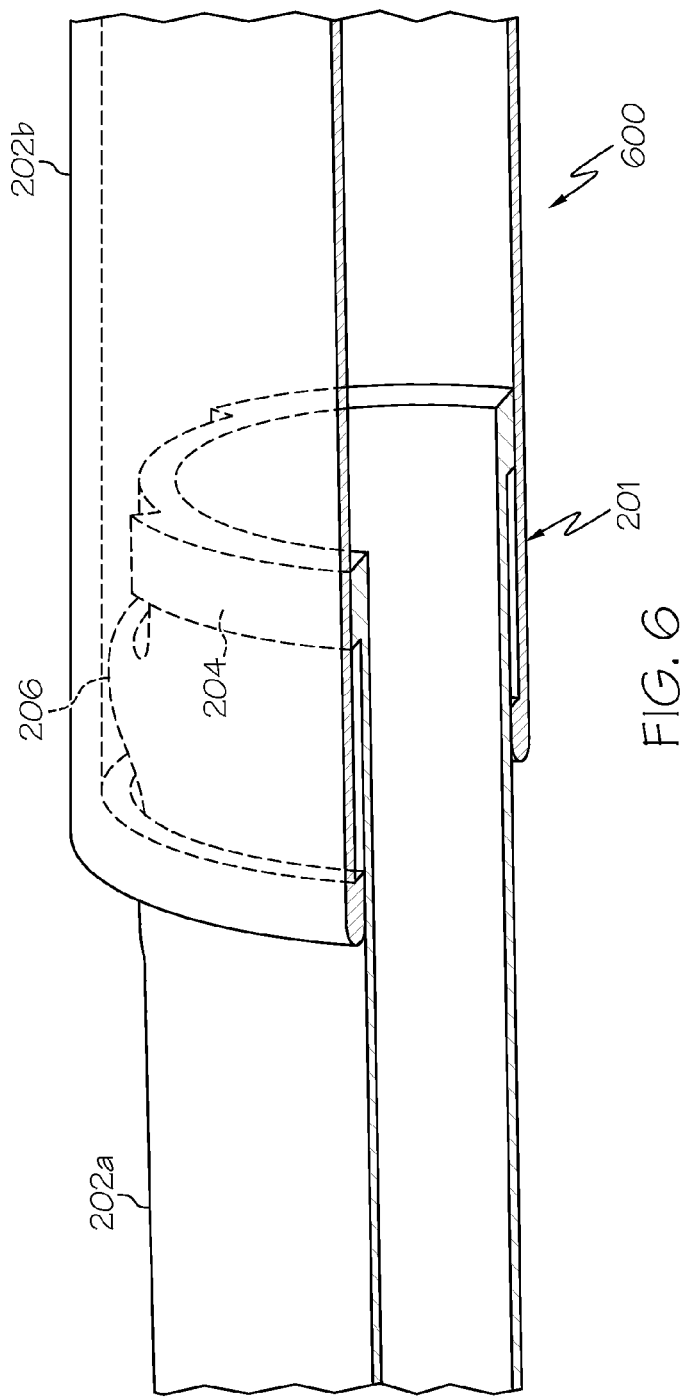
FIG. 6 depicts a simulation of the product, with the inner part and the outer part assembled, according to systems and methods disclosed herein.

FIG. 6 depicts a simulation 600 of the product 201, with the inner part 202a and the outer part 202b assembled, according to systems and methods disclosed herein. As illustrated, the inner part 202a has been inserted into the outer part 202b. However, the simulation 600 is utilized to model the retraction force and the separation force required to disassemble the product 201 (partially and/or fully, depending on the particular invention). Similar to the first assembly force, the second assembly force, and the retraction force, the separation force may be determined and compared to a predetermined separation force threshold. The predetermined assembly force threshold may be a value (or range of values) that allows the user to easily disassemble the product 201 (partially and/or fully), when desired, but remained assembled when in use.

Figure 7:
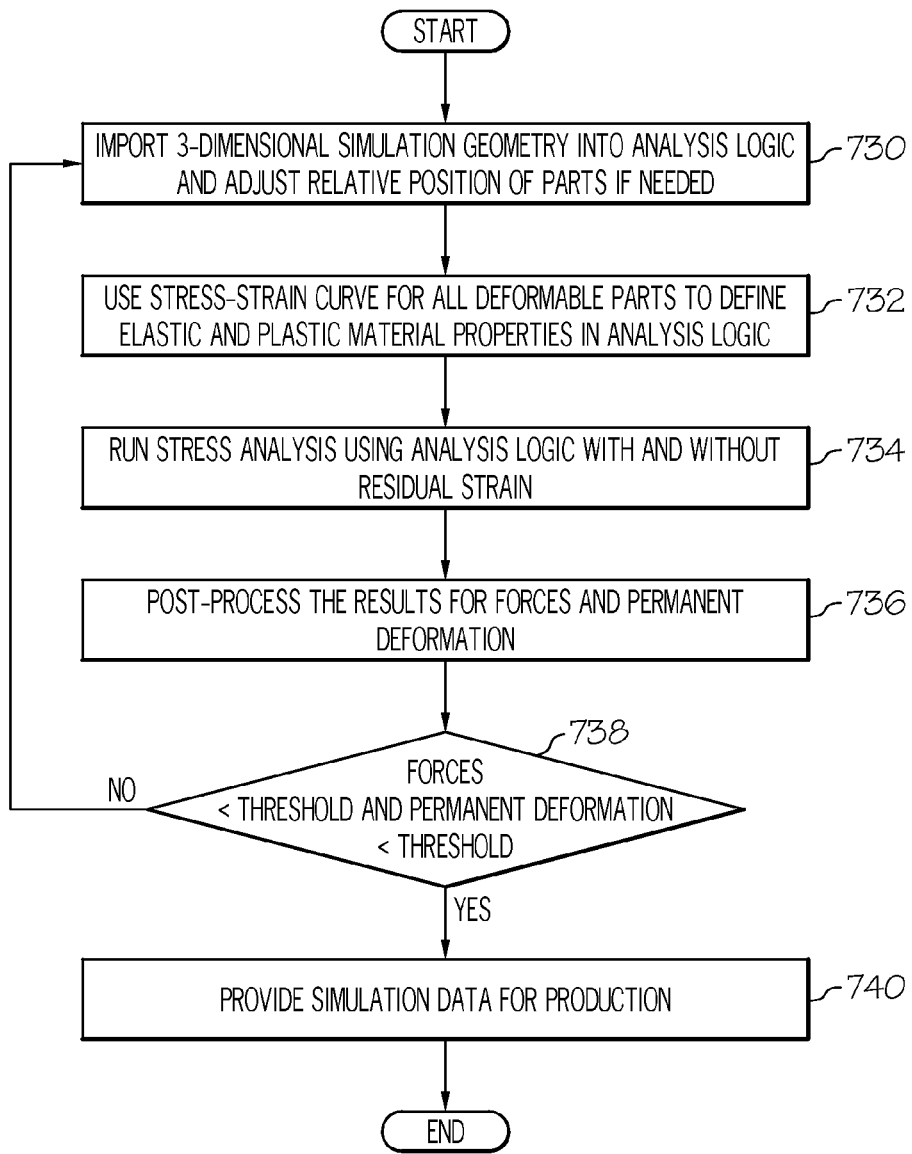
FIG. 7 depicts a flowchart for modeling compliant parts, according to systems and methods disclosed herein.

FIG. 7 depicts a flowchart for modeling compliant parts, according to systems and methods disclosed herein. As illustrated in block 730, a 3-dimensional simulation geometry may be imported into the analysis logic 144b and the relative position of parts 202a, 202b may be adjusted. As indicated above, the 3-dimensional simulation may be generated by the computing device 100 and/or the 3-dimensional simulation may be generated by another computing device (via the simulation logic 144a, which may reside on the other computing device) and then sent to the computing device 100. Regardless, in block 732, the analysis logic 144b may utilize a stress-strain curve for the deformable parts 202a, 202b to define elastic and plastic material properties. In some inventions, the stress-strain curve is that is based on ASTM D 638-2008 standard Tensile test for Type 1 tensile bars, 23 C room temperature, 47% Relative Humidity and cross head speed of 5 mm/min. More specifically, the stress-strain curve may be determined by a materials test. As an example, a piece of material that is desired for the product 201 may be sent to a material tester, who determines the strain the material can withstand at various levels of stress. This information may be determined and stored in the computing device 100 and/or other places. Regardless, the computing device 100 accesses the stress-strain curve for the deformable parts 202a, 202b of the product 201. In block 734, a stress analysis may be run using the analysis logic 144b, with and without residual strain. In block 736, the results may be post processed for the first assembly force, the second assembly force, the retraction force, and the separation force, as well as for the permanent deformation value. In block 738, a determination may be made regarding whether the forces are less than predetermined thresholds and whether the permanent deformation value is less than a predetermined threshold.

As an example, the first assembly force threshold may range from about 0.1 Newtons to about 1000 Newtons. The second assembly force threshold may range from about 0.1 Newtons to about 1000 Newtons. The retraction force threshold may range from about 0.1 Newtons to about 1000 Newtons. The separation force threshold may range from about 0.1 Newtons to about 1000 Newtons. Additionally, the permanent deformation value threshold may range from about 0.1% to about 20%.

Regardless, if at block 738, the simulated forces are less than the thresholds, and the permanent deformation value is less than the threshold, the process may proceed to block 740. In block 740 the simulation data may be provided to produce the product 201. If either one of the forces or the permanent deformation value does not meet its respective threshold, the process may return to block 730 to alter the simulation and repeat the process.

It should be understood that if one or more of the thresholds are not met, a user may manually make a determination of where the product design is deficient, make the changes, and then perform the process again. However, some of the systems and/or methods described herein may be configured to automatically determine a change that may be made to improve the product design. As an example, if the permanent deformation value exceeds the desired threshold, the system may be configured to determine whether another material may be utilized to improve the results. Similarly, in some inventions, the systems and/or methods described herein may monitor improvements to product designs and utilize that historical data to determine solutions to future products.

It should also be understood that in some of the systems and/or methods disclosed herein a determination may also be made regarding whether it is feasible for the product design to be manufactured. More specifically, the computing device 100 may determine whether the simulation meets the predetermine thresholds. If so, the product design may be sent to a manufacture to determine whether an actual product may be constructed from the product design. In some of the systems and/or methods, the computing device 100 may make this determination. Regardless, if it is not feasible to manufacture the product 201 under a current design, the computing device 100 may make design changes and then return to block 730.

Figure 8:
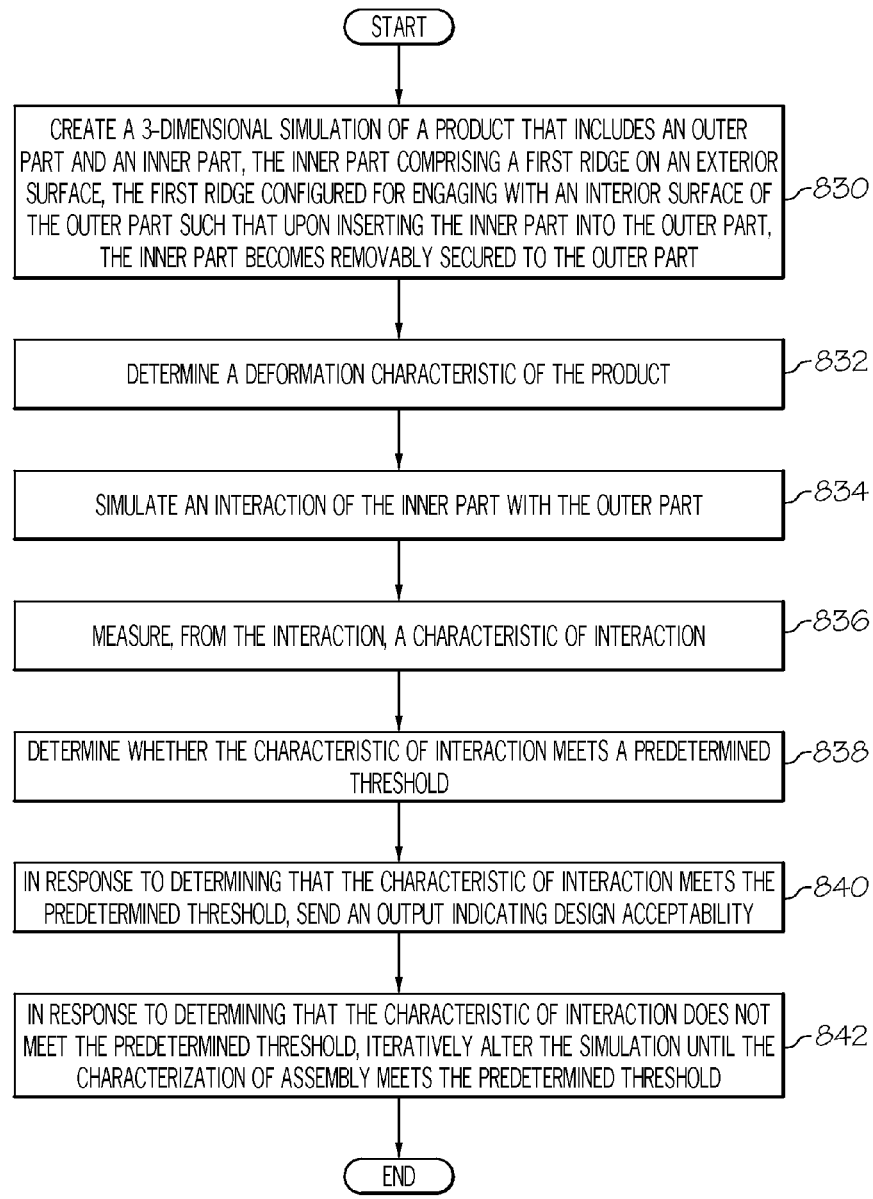
FIG. 8 depicts another flowchart for modeling compliant parts, according to systems and methods disclosed herein.

FIG. 8 depicts another flowchart for modeling compliant parts, according to systems and methods disclosed herein. As illustrated in block 830, a 3-dimensional simulation of a product 201 may be created. The 3-dimensional simulation may include the outer part 202b and the inner part 202a. The inner part 202a may include a first ridge 204 on an exterior surface of the inner part 202a. The first ridge 204 may be configured for engaging with an interior surface of the outer part 202b such that upon inserting the inner part 202a into the outer part 202b, the inner part 202a becomes removably secured to the outer part 202b. At block 832, a determination of a deformation characteristic may be determined for the product 201. As an example, the system and/or method may determine the resiliency of the material from a stress-strain curve and/or other data. In block 834, an interaction of the inner part 202a with the outer part 202b may be simulated. More specifically, the interaction may be the assembly and/or disassembly of the product 201. In block 836, a characteristic of the interaction may be measured from the interaction. The first assembly force, the second assembly force, the retraction force, the separation force, and/or the permanent deformation value may be determined. In block 838, a determination may be made regarding whether the characteristic of interaction meets the predetermined threshold. As discussed above, the predetermined thresholds may include the first assembly force threshold, the second assembly force threshold, the retraction force threshold, the separation force threshold, and/or the permanent deformation value threshold. In block 840, in response to determining that the characteristic of interaction meets the predetermined threshold, an output may be sent that indicated the product design acceptability. However, in block 842, in response to determining that the characteristic of interaction does not meet the predetermined threshold, the simulation may be iteratively altered until the characteristic of interaction meets the predetermined threshold. More specifically, the simulation may be altered and the process may be repeated.

Depending on the particular deficiencies of the simulation with regard to the characteristic of interaction, the material type may be altered, the size and/or shape of the first ridge 204 may be altered, the size and/or shape of the second ridge 206 may be altered, the size and/or shape of the inner part 202a may be altered, the size and/or shape of the outer part 202b may be altered, etc. As an example, altering the material type may include adding a material to the product 201, removing a material from the product 201, changing the relative amount of a material in the product 201 (e.g., changing material 1 from 25% to 27% of the total materials used and changing material 2 from 75% to 73% of the total materials used), and/or other alteration.

Validation of Modeling Forces and Coefficient of Friction Sensitivity

Modeling forces are compared with experimental test results for a tampon applicator in the table 1 below which clearly show that the modeling forces agree very well with test results. All the force values are in Newtons. The test values reported are average followed by standard deviation (e.g., 105+/−35 means that 105 is the average and 35 is the standard deviation).

TABLE 1

Comparison of Modeling forces with test results

|  | $1^{st}$ Assembly force | $2^{nd}$ Assembly force | Retraction force | Separation force |
|---|---|---|---|---|
| Test | 105 +/− 35 | 68 +/− 9 | 14 +/− 2 | 59 +/− 22 |
| Modeling | 92 | 79 | 10 | 56 |

A detailed investigation of coefficient of friction sensitivity indicated that a Coulomb friction value of 0.3 gave the best agreement with test results. The topic of friction is highly complex as it depends on natural lubrication of material (material characteristic), surface roughness (molding or machining characteristic), sliding velocity and contact pressure (process conditions), humidity and dirt (environmental conditions).

The dimensions and values disclosed herein are not to be understood as being strictly limited to the exact numerical values recited. Instead, unless otherwise specified, each such dimension is intended to mean both the recited value and a functionally equivalent range surrounding that value. For example, a dimension disclosed as "40 mm" is intended to mean "about 40 mm."

Every document cited herein, including any cross referenced or related patent or application is hereby incorporated herein by reference in its entirety unless expressly excluded or otherwise limited. The citation of any document is not an admission that it is prior art with respect to any invention disclosed or claimed herein or that it alone, or in any combination with any other reference or references, teaches, suggests or discloses any such invention. Further, to the extent that any meaning or definition of a term in this document conflicts with any meaning or definition of the same term in a document incorporated by reference, the meaning or definition assigned to that term in this document shall govern.

While the systems and methods of this disclosure have been illustrated and described, it would be understood to those skilled in the art that various other changes and modifications can be made without departing from the spirit and scope of the invention. It is therefore intended to cover in the appended claims all such changes and modifications that are within the scope of this invention.

What is claimed is:

1. A system for modeling compliant parts, comprising:
a memory component that stores logic that when executed by the system causes the system to perform at least the following:
receive a 3-dimensional simulation of a product that comprises an outer part and an inner part, the inner part comprising a first ridge on an exterior surface, the first ridge configured for engaging with an interior surface of the outer part such that upon inserting the inner part into the outer part, the inner part becomes removably secured to the outer part;
determine a deformation characteristic of the product;

simulate an interaction of the inner part with the outer part;

measure, from the interaction, a first assembly force, a separation force, a retraction force, and a permanent deformation value, wherein the first assembly force represents a first force for overcoming resistance to assembly created by the first ridge, and wherein the separation force represents a second force for overcoming the first ridge when removing the inner part from the outer part;

determine whether the first assembly force meets a predetermined first assembly force threshold;

determine whether the second assembly force meets a predetermined second assembly force threshold;

determine whether the separation force meets a predetermined separation force threshold;

determine whether the retraction force meets a predetermined retraction force threshold;

determine whether the permanent deformation value meets a predetermined permanent deformation threshold;

in response to determining that the first assembly force meets the predetermined first assembly force threshold, the second assembly force meets the predetermined second assembly force threshold, the separation force meets the predetermined separation force threshold, the retraction force meets the predetermined retraction force threshold, and the permanent deformation value meets the predetermined permanent deformation threshold, send an output that indicates the first 3-dimensional simulation and the second 3-dimensional simulation are acceptable product designs; and in response to determining that at least one of the following: the first assembly force does not meet the predetermined first assembly force threshold, second assembly force does not meet the predetermined second assembly force threshold, the retraction force does not meet the predetermined retraction force threshold, the separation force does not meet the predetermined separation force threshold, and the permanent deformation value does not meet the predetermined permanent deformation threshold, iteratively alter the 3-dimensional simulation until the first assembly force meets the predetermined first assembly force threshold, the second assembly force meets the predetermined second assembly force threshold, the separation force meets the predetermined separation force threshold, the retraction force meets the predetermined retraction force threshold, and the permanent deformation value meets the predetermined permanent deformation threshold;

wherein the predetermined first assembly force threshold is from about 0.1 Newtons to about 80 Newtons;

wherein the predetermined second assembly force threshold is from about 0.1 Newtons to about 80 Newtons;

wherein the predetermined retraction force threshold is from about 0.1 Newtons to about 40 Newtons;

wherein the predetermined separation force threshold is from about 0.1 Newtons to about 60 Newtons;

wherein the predetermined permanent deformation threshold is from about 0.1% to about 20%;

wherein the separation force is greater than the retraction force; and wherein the second assembly force is at least double the retraction force.

2. The system of claim 1, wherein the deformation characteristic comprises a stress-strain curve that is based on ASTM D 638-2008 standard Tensile test for Type 1 tensile bars, 23 C room temperature, 47% Relative Humidity and cross head speed of 5 mm/min.

3. The system of claim 1, wherein the first ridge is disposed proximate to an end of the inner part and wherein the inner part further comprises a second ridge disposed further from the end than the first ridge.

4. The system of claim 1, wherein the product comprises at least one of the following: a tampon applicator, a razor, a coffee maker, a children's toy, a child-resistant packaging, a snap bottle closure, and a product packaging.

5. The system of claim 1, wherein altering the 3-dimensional simulation comprises at least one of the following: altering a shape of the 3-dimensional simulation, altering a size of the 3-dimensional simulation, altering a material for the 3-dimensional simulation, adding a material to the 3-dimensional simulation, and removing a material from the 3-dimensional simulation.

* * * * *